(12) United States Patent
Taguchi

(10) Patent No.: US 9,004,667 B2
(45) Date of Patent: Apr. 14, 2015

(54) LIGHT IRRADIATION DEVICE, LIGHT IRRADIATION MODULE, AND PRINTING APPARATUS

(75) Inventor: Akira Taguchi, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 38 days.

(21) Appl. No.: 13/811,632

(22) PCT Filed: Jul. 22, 2011

(86) PCT No.: PCT/JP2011/066690
§ 371 (c)(1),
(2), (4) Date: Jan. 22, 2013

(87) PCT Pub. No.: WO2012/011562
PCT Pub. Date: Jan. 26, 2012

(65) Prior Publication Data
US 2013/0120514 A1 May 16, 2013

(30) Foreign Application Priority Data

Jul. 23, 2010 (JP) ................................ 2010-165862

(51) Int. Cl.
*B41J 11/00* (2006.01)
*F21V 29/00* (2006.01)
(Continued)

(52) U.S. Cl.
CPC ....... *B41J 11/002* (2013.01); *B41J 2/45* (2013.01); *H01L 25/0753* (2013.01);
(Continued)

(58) Field of Classification Search
CPC ........ B41J 2/01; B41J 11/0015; B41J 11/002; B41M 7/0072; C09D 11/101; F21K 9/00; F21V 29/004; F21V 29/02; F21V 29/2293; F21Y 2101/02

USPC ............... 347/102; 362/294; 34/113; 101/35; 257/98, 99
See application file for complete search history.

(56) References Cited

U.S. PATENT DOCUMENTS

| | | |
|---|---|---|
| 7,532,479 B2 | 5/2009 | Ohno et al. |
| 2007/0200133 A1 | 8/2007 | Hashimoto et al. |

(Continued)

FOREIGN PATENT DOCUMENTS

| | | |
|---|---|---|
| CN | 101259787 A | 9/2008 |
| JP | 2002-184915 A | 6/2002 |

(Continued)

OTHER PUBLICATIONS

Japanese Office Action with a concise explanation thereof corresponding to Japanese Patent Appln. No. 2012-525438 dated Aug. 20, 2013.

(Continued)

*Primary Examiner* — Manish S Shah
*Assistant Examiner* — Roger W Pisha, II
(74) *Attorney, Agent, or Firm* — Volpe and Koenig, P.C.

(57) ABSTRACT

A light irradiation device according to an embodiment includes a light emitting element, and a substrate on which the light emitting element is mounted. The substrate includes a laminated body constituted so that a plurality of insulating layers are laminated, a first heat transfer member disposed in the laminated body so that a part thereof is located directly below the light emitting element, and a second heat transfer member disposed between the insulating layers so as to surround the first heat transfer member when seen in a plan view. Thermal conductivities of the first heat transfer member and second heat transfer member are higher than a thermal conductivity of the laminated body.

14 Claims, 15 Drawing Sheets

(51) Int. Cl.
*B41J 2/45* (2006.01)
*H01L 25/075* (2006.01)
*H01L 33/64* (2010.01)

(52) U.S. Cl.
CPC ............ *F21V 29/004* (2013.01); *H01L 33/642* (2013.01); *H01L 2224/48091* (2013.01); *H01L 2224/73265* (2013.01); *H01L 2924/09701* (2013.01); *H01L 2224/32245* (2013.01); *H01L 2224/48227* (2013.01); *H01L 2224/45124* (2013.01); *H01L 2224/45144* (2013.01)

(56) References Cited

U.S. PATENT DOCUMENTS

| | | | |
|---|---|---|---|
| 2008/0198552 A1* | 8/2008 | Cho et al. | 361/704 |
| 2008/0211893 A1* | 9/2008 | Oyanagi et al. | 347/102 |
| 2008/0258164 A1* | 10/2008 | Masui et al. | 257/98 |
| 2008/0283860 A1 | 11/2008 | Suehiro et al. | |
| 2009/0026485 A1* | 1/2009 | Urano et al. | 257/99 |
| 2009/0095967 A1* | 4/2009 | Masui et al. | 257/98 |
| 2010/0148196 A1* | 6/2010 | Kamada et al. | 257/98 |
| 2010/0182791 A1 | 7/2010 | Hitomi et al. | |
| 2010/0237375 A1* | 9/2010 | Yamazaki et al. | 257/98 |
| 2010/0246135 A1 | 9/2010 | Hongo et al. | |
| 2011/0006323 A1* | 1/2011 | Suzuki et al. | 257/98 |
| 2011/0079805 A1* | 4/2011 | Yu et al. | 257/98 |

FOREIGN PATENT DOCUMENTS

| | | |
|---|---|---|
| JP | 2006060070 A | 3/2006 |
| JP | 2006-229151 A | 8/2006 |
| JP | 2006-287020 A | 10/2006 |
| JP | 2007-096285 A | 4/2007 |
| JP | 2008177445 A | 7/2008 |
| JP | 2008-311471 A | 12/2008 |
| JP | 2010149381 A | 7/2010 |
| JP | 2010-238941 A | 10/2010 |
| JP | 2010274256 A | 12/2010 |

OTHER PUBLICATIONS

Japanese Decision of Refusal with a concise explanation thereof corresponding to Japanese Patent Appln. No. 2012-525438 dated Dec. 10, 2013.

European Search Report, European Patent Appln. No. 11809732.8, Apr. 30, 2014, 12 pp.

Chinese Office Action with a concise explanation thereof corresponding to Chinese Patent Application No. 201180035873.0 dated Nov. 27, 2014.

\* cited by examiner

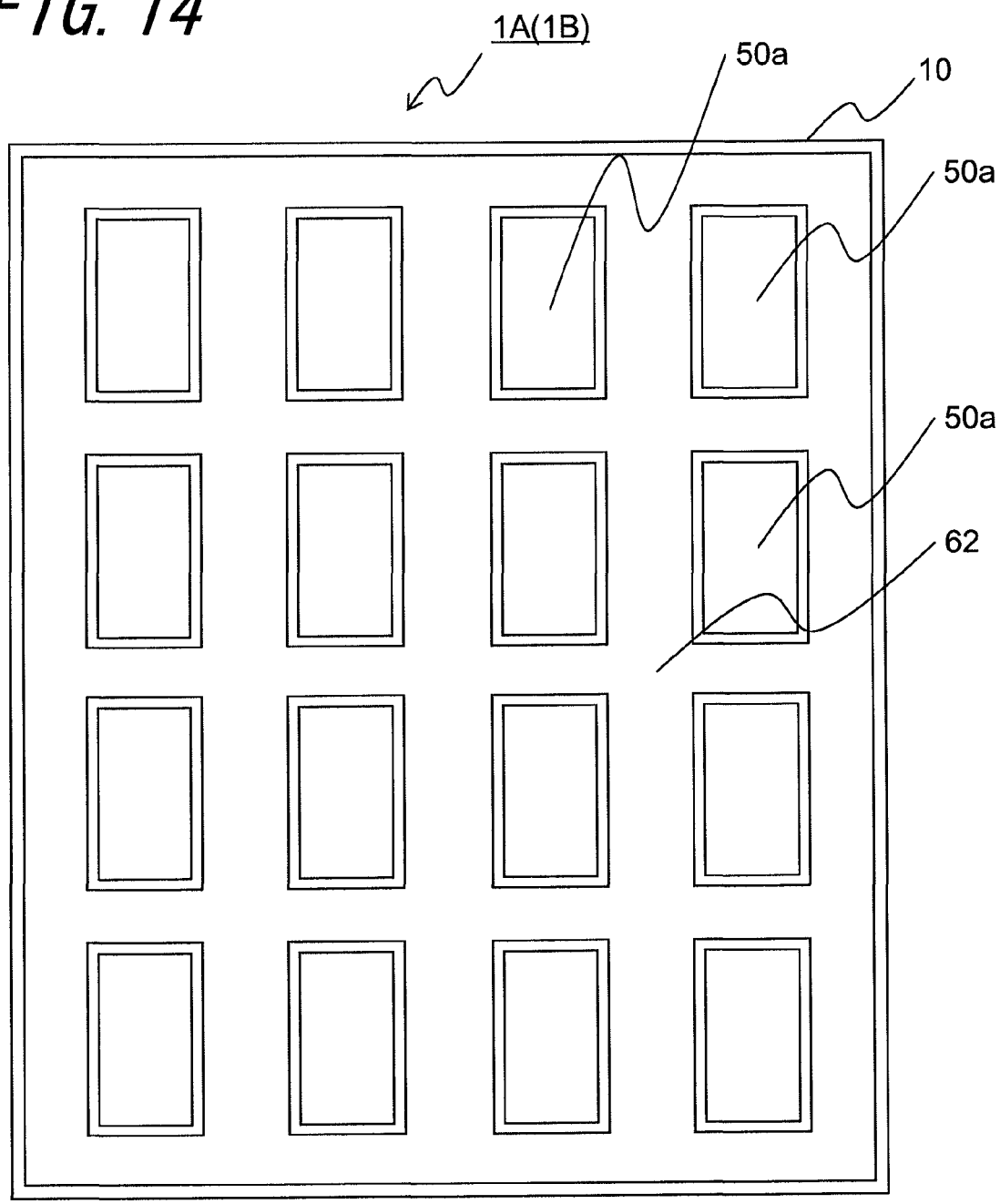

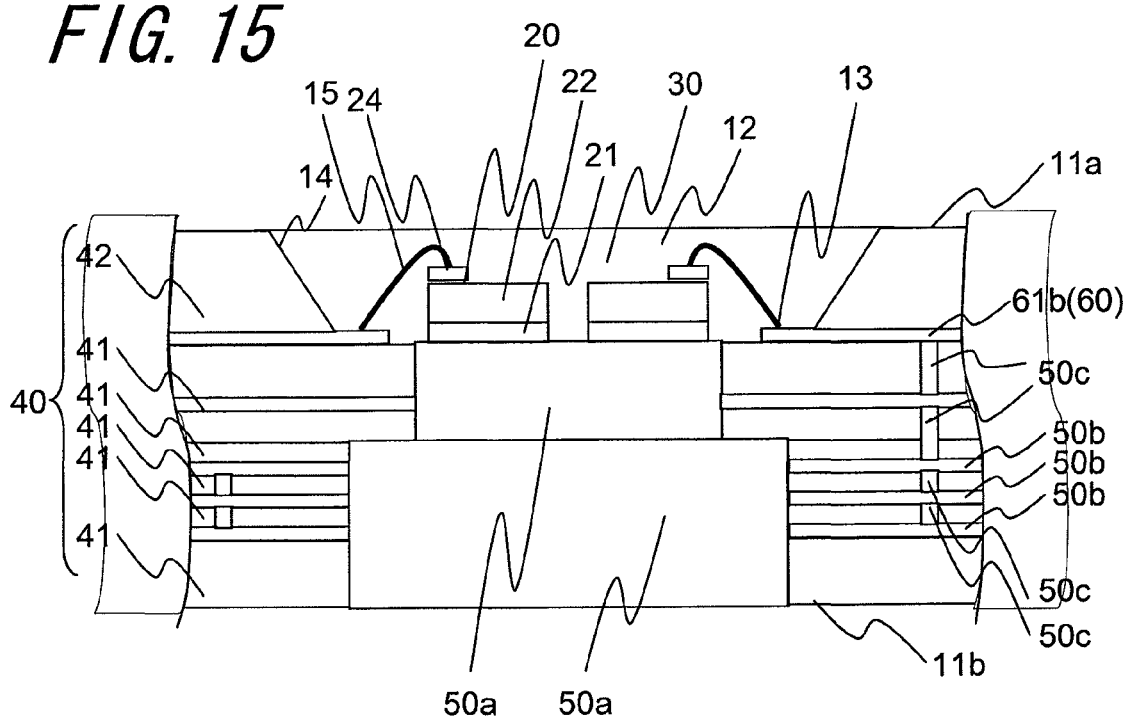
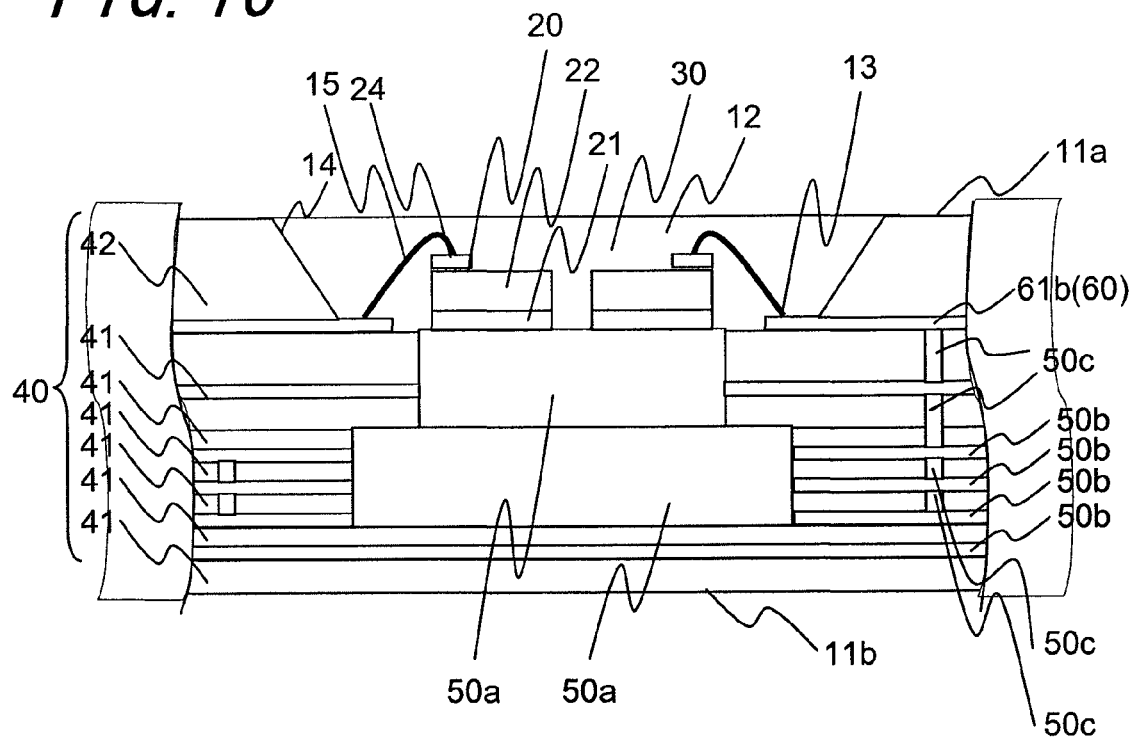

LIGHT IRRADIATION DEVICE, LIGHT IRRADIATION MODULE, AND PRINTING APPARATUS

TECHNICAL FIELD

The present invention relates to a light irradiation device which is used for curing UV curable resin or paint, a light irradiation module, and a printing apparatus.

BACKGROUND ART

In the past, a UV irradiation device has been widely used in fluorescence reaction observations in the medical or biological field, for sterilization, adhesion of electronic components, curing of UV curable resins and inks, and the like. In particular, a high pressure mercury lamp, a metal-halide lamp, or the like are used as a lamp light source of a UV irradiation device which is used when curing the UV curable resin used when adhering small sized components or the like in a field of electronic components or the like, curing UV curable ink which is used in the printing field, or the like.

In recent years, a movement toward adopting UV light emitting elements which have a relatively long life, are energy saving, and are able to suppress generation of ozone as a lamp light source has become active, since a reduction in load on the global environment is demanded worldwide.

Meanwhile, since generation of heat due to driving of the UV light emitting element is relatively high, for example as disclosed in Patent Literature 1, a technology has been proposed in which a heat radiation member is provided in a light emitting element mounting substrate, and heat from the light emitting element is effectively radiated.

However, since the demand for improved illuminance of light emission has gradually become stronger, and there is a tendency for the number of mounted light emitting elements to increase, a heat radiation structure in which heat can be effectively radiated has become desirable.

CITATION LIST

Patent Literature

Patent Literature 1: Japanese Unexamined Patent Publication JP-A 2006-287020

SUMMARY OF INVENTION

The invention has been made through consideration of the above-described problem, and an object thereof is to provide a light irradiation device, a light irradiation module and a printing apparatus which have a relatively high heat radiation property while securing reliability of a substrate for a light emitting element even when heat from the light emitting element becomes high.

A light irradiation device according to an embodiment of the invention includes a light emitting element, and a substrate on which the light emitting element is mounted. The substrate includes a laminated body constituted so that a plurality of insulating layers are laminated, a first heat transfer member disposed in the laminated body so that a part thereof is located directly below the light emitting element, and a second heat transfer member disposed between the insulating layers so as to surround the first heat transfer member when seen in a plan view. Thermal conductivities of the first heat transfer member and second heat transfer member are higher than a thermal conductivity of the laminated body.

In addition, the light irradiation module according to an embodiment of the invention includes a plurality of light irradiation devices described above, and a heat radiation member on which the plurality of light irradiation devices are mounted.

Further, the printing apparatus according to an embodiment of the invention includes printing means which performs printing on a recording medium, and the light irradiation module described above, the light irradiation module irradiating the printed recording medium with light.

According to the above-described light irradiation device, light irradiation module and printing apparatus, it is possible to effectively radiate heat which is generated due to driving of the light emitting element, for example, even when a relatively large number of light emitting elements are mounted on the substrate and as a result, to make an intensity of illuminance of the light emitting element relatively high, and to make variation in illuminance between light emitting elements in a substrate relatively small.

BRIEF DESCRIPTION OF DRAWINGS

FIG. 14 is a transparent view illustrating an arrangement of electrode layers;

FIG. 15 is a cross-sectional view illustrating a fourth modified example of the light irradiation device of FIG. 1;

FIG. 16 is a cross-sectional view illustrating a fifth modified example of the light irradiation device of FIG. 1;

DESCRIPTION OF EMBODIMENTS

Hereinafter, a light irradiation device, a light irradiation module, and a printing apparatus of the invention will be described with reference to drawings.

First Embodiment of Light Irradiation Device

Figure 1:
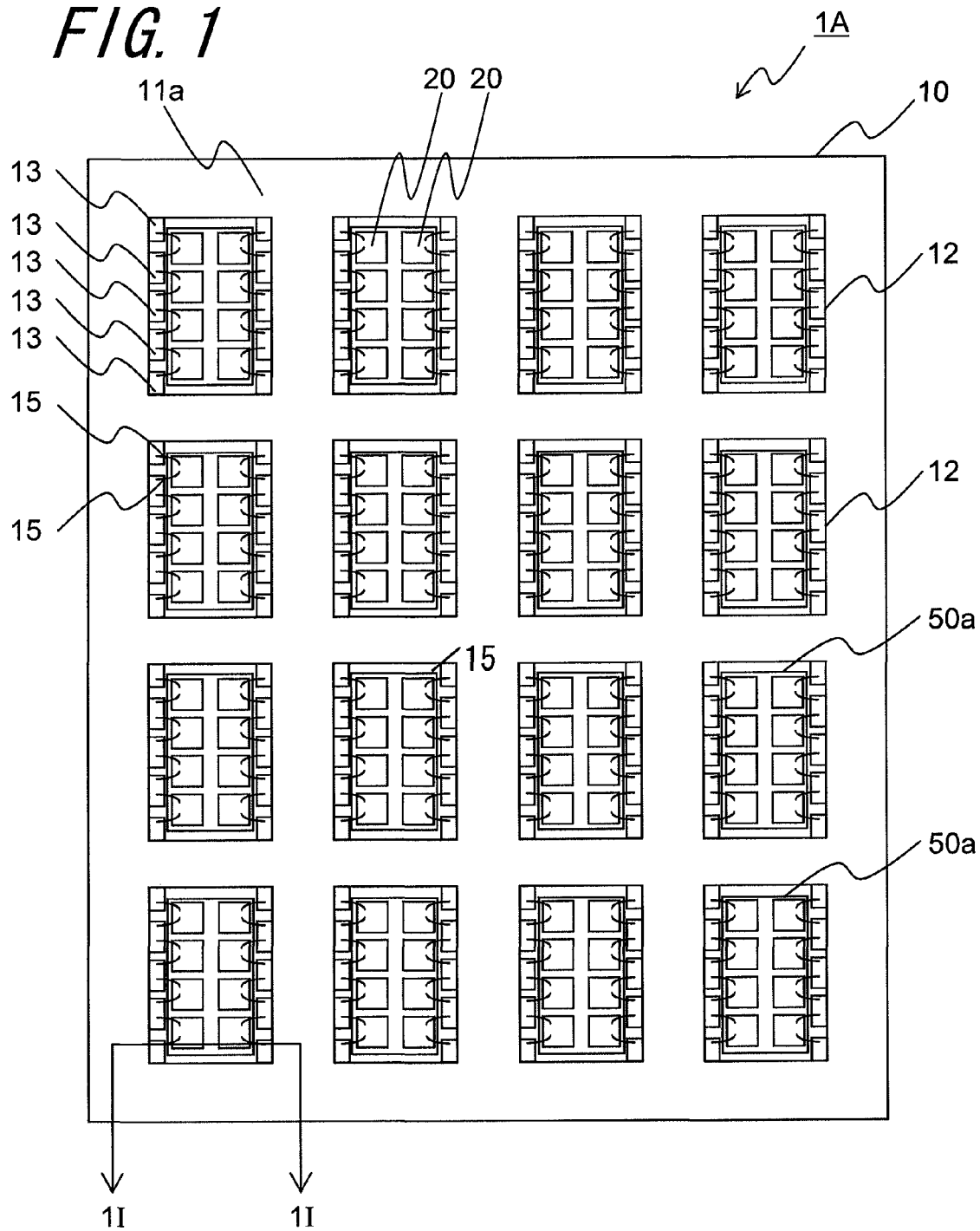
FIG. 1 is a plan view of a light irradiation device according to a first embodiment of the invention.
Figure 2:
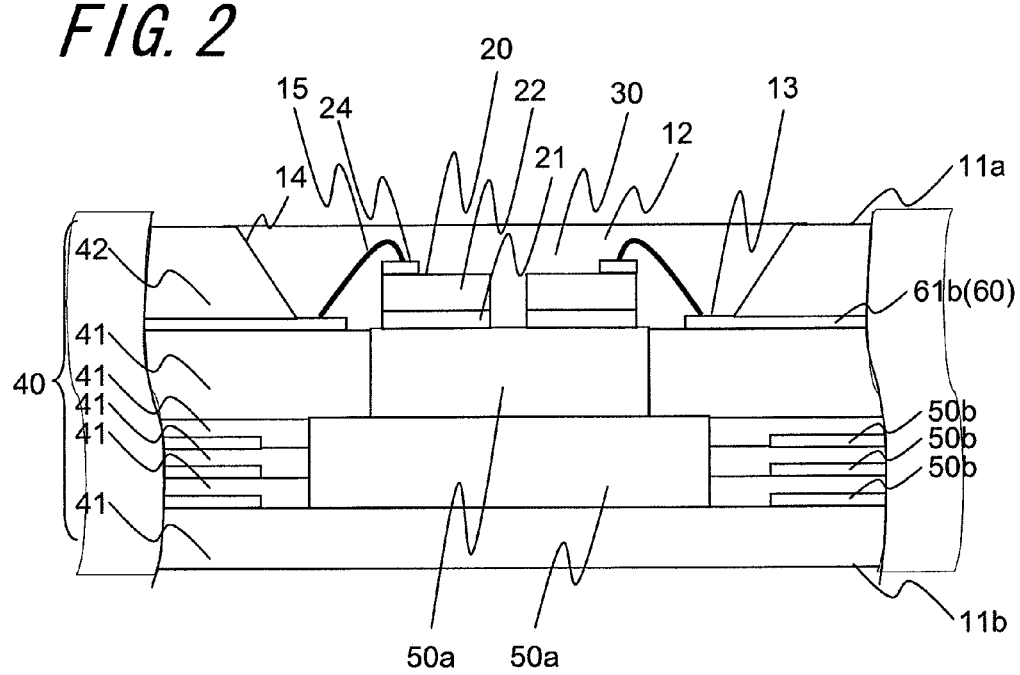
FIG. 2 is a cross-sectional view taken along the line 1I-1I of the light irradiation device illustrated in FIG. 1.

A light irradiation device 1A according to a first embodiment of the invention which is illustrated in FIGS. 1 and 2 is installed in an offset printing apparatus in which UV curable ink is used, or in a printing apparatus such as an ink jet printing apparatus, and functions as a UV light generation source of a UV light irradiation module which cures UV curable ink by irradiating a recording medium on which the UV curable ink is borne, with UV light.

The light irradiation device 1A includes a substrate 10 which has a plurality of opening portions 12 in a first main surface 11a, a plurality of connection pads 13 which are disposed in each of the opening portions 12, a plurality of light emitting elements 20 which are disposed in each opening portion 12 of the substrate 10, and are electrically connected to the connection pads 13, and a plurality of sealing members 30 which fill each of the opening portions 12, and cover the light emitting elements 20.

The substrate 10 includes a laminated body 40 constituted so that a plurality of first insulating layers 41 and a second insulating layer 42 are laminated, a first heat transfer member 50a which is disposed in the laminated body 40 and on a top face of which the plurality of light emitting elements 20 are mounted, second heat transfer members 50b which are disposed between the insulating layers 41, and an electrical wiring 60 via which the light emitting elements 20 are connected to one another, and which is formed in a substantially rectangular shape when seen in a plan view from the first main surface 11a side and supports the plurality of light emitting elements 20 in the opening portions 12 which are provided on the first main surface 11a.

The first insulating layer 41 is formed of an aluminum oxide sintered body, an aluminum nitride sintered body, a mullite sintered body, ceramics such as glass ceramics, and resin such as epoxy resin, liquid crystal polymer (LCP), or the like.

The first heat transfer member 50a is formed in a predetermined shape using a material such as copper (Cu), tungsten (W), molybdenum (Mo), silver (Ag), copper-tungsten (Cu—W), copper-molybdenum (Cu—Mo), or the like, with a higher thermal conductivity than that of the first insulating layer 41, and one or a plurality of (eight in the embodiment) light emitting elements 20 are mounted on the top face of the first heat transfer member 50a which is exposed from the first insulating layer 41. It is possible to effectively radiate heat which is generated due to driving of the light emitting element 20, since the light emitting element 20 is mounted on the exposed top face of the first heat transfer member 50a having a high thermal conductivity, through an adhesive (not shown) such as epoxy resin, in this manner.

In addition, a material of the first heat transfer member 50a is not limited to the above-described metal, and may be a material in which metal filler such as gold (Au), silver (Ag), copper (Cu), or the like, is included in a resin such as epoxy resin, silicone resin, or polyimide resin, or may be a carbon fiber-reinforced carbon matrix-composite (carbon-carbon, carbon-carbon composite, or reinforced carbon-carbon (RCC)).

Accordingly, it is possible to effectively radiate the heat which is generated due to the driving of the light emitting element 20, and as a result to make an intensity of illuminance of the light emitting element 20 relatively high, and to make variation in illuminance between light emitting elements in the substrate relatively small.

In a shape of the first heat transfer member 50a according to the embodiment, a cross-sectional area thereof becomes large from the first main surface 11a on which the light emitting element 20 is mounted as illustrated in FIG. 2 toward a second main surface 11b which faces the first main surface 11a. By providing such a shape, it is possible to more effectively radiate the heat which is generated in the light emitting element 20. However, when a volume of the first heat transfer member 50a which occupies the substrate 10 becomes large, separation may occur between the first heat transfer member 50a and the laminated body 40. This is because when the light emission element 20 generates heat, thermal stress occurs at an interface between the first heat transfer member and the laminated body 40 due to an unconformity between a thermal expansion coefficient of the first heat transfer member 50a and a thermal expansion coefficient of the laminated body 40. Accordingly, the shape and dimensions of the first heat transfer member 50a may be suitably adjusted so that separation does not occur on an interface between the first heat transfer member 50a and the laminated body 40 in consideration of a heat value from the light emitting element 20.

Figure 3:
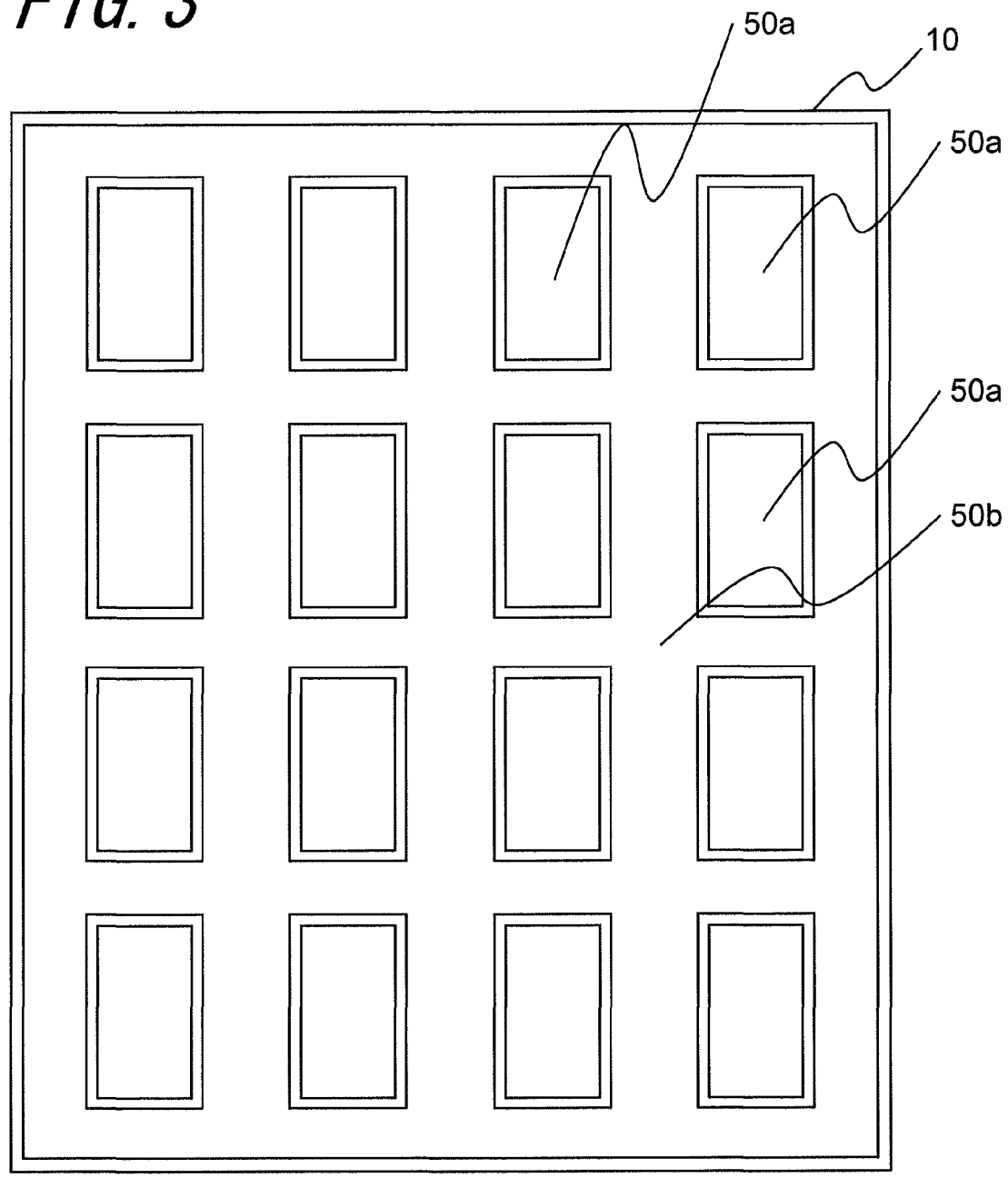
FIG. 3 is a transparent view illustrating an arrangement of a first heat transfer member and a second heat transfer member which constitute the light irradiation device according to the first embodiment of the invention.

On the other hand, similarly to the first heat transfer member 50a, the second heat transfer member 50b is formed of a material with a higher thermal conductivity than that in the first insulating layer 41 such as copper (Cu), tungsten (W), molybdenum (Mo), silver (Ag), copper-tungsten (Cu—W), and copper-molybdenum (Cu—Mo), and as illustrated in FIG. 3, the second heat transfer member 50b is disposed so as to surround the first heat transfer member 50a when viewing through the first main surface 11a side. By arranging the second heat transfer member 50b so as to surround the first heat transfer member 50a in this manner, it is possible to further effectively radiate the heat generated from the light emitting element 20. This is because the heat which is transferred from the light emitting element 20 is transferred to the second heat transfer member 50b from the whole outer peripheral region of the first heat transfer member 50a. According to the embodiment, as illustrated in FIG. 2, the second heat transfer member 50b of three layers are disposed so as to surround the first heat transfer member 50a. In addition, the number of layers of the second heat transfer member 50b, the shape, or the like may be suitably adjusted in consideration of the generated heat value of the light emitting element 20, and the radiated heat value of the first heat transfer member 50a. For example, according to the embodiment, the second heat transfer members 50b which are disposed between the same first laminated layers 41 are integrally formed, however, the second heat transfer members 50b may be formed by being divided, or may have a different shape from the second heat transfer members 50b which are disposed between other first insulating layers 41.

In addition, the material of the first heat transfer member 50a is not limited to the above-described metal, may be a material in which metal filler such as gold (Au), silver (Ag), copper (Cu), or the like, is included in resin such as an epoxy resin, silicone resin, polyimide resin, and may be carbon fiber-reinforced carbon matrix-composite (carbon-carbon, carbon-carbon composite, or reinforced carbon-carbon (RCC)).

Figure 4:
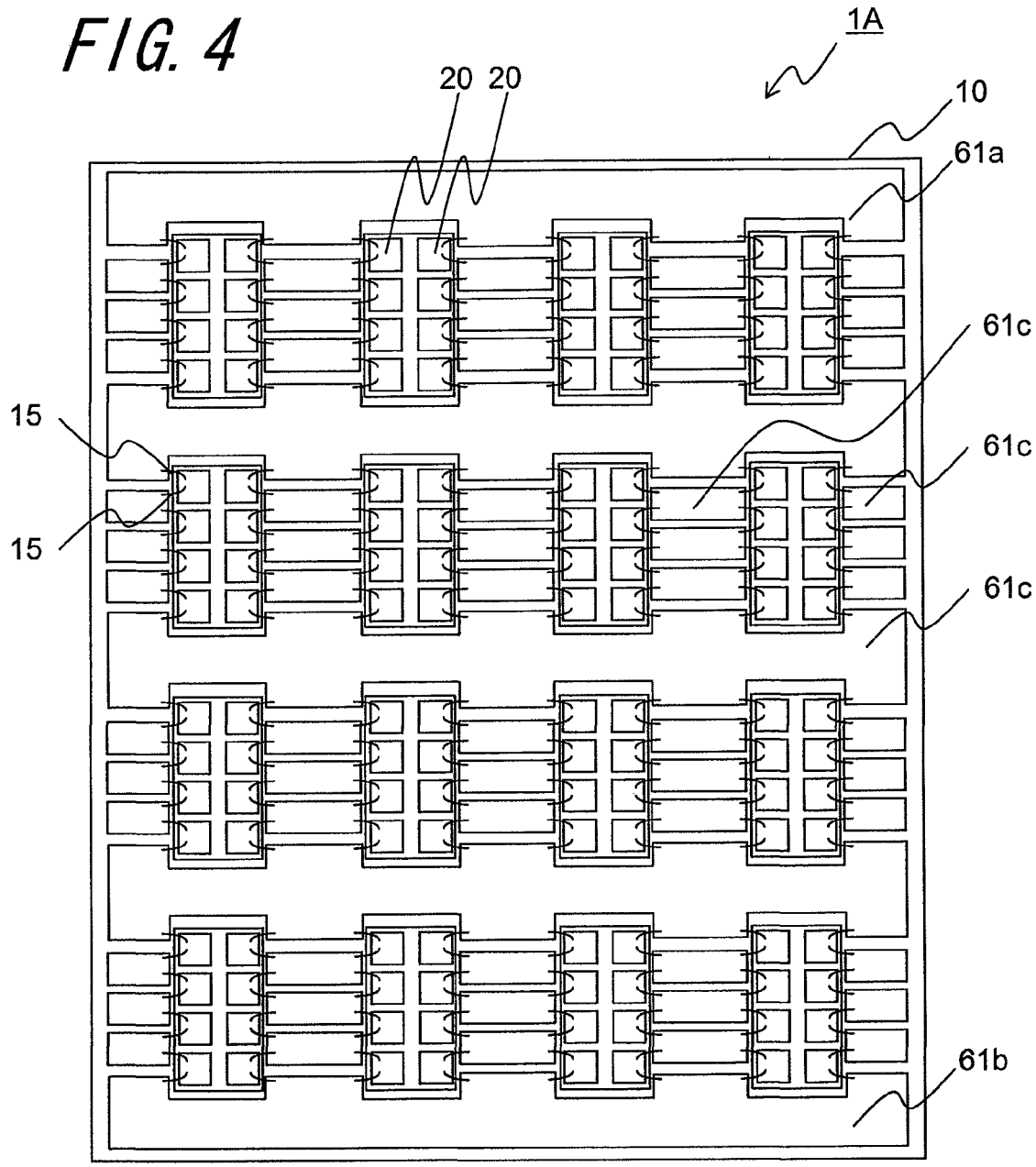
FIG. 4 is a transparent view illustrating an arrangement of an electrical wiring which constitutes the light irradiation device according to the first embodiment of the invention.

The electrical wiring 60 includes an anode wiring 61a which is connected to an anode of the light emitting element 20, a cathode wiring 61b which is connected to a cathode, and a common wiring 61c for connecting the anode and cathode to each other, and is disposed as illustrated in FIG. 4 (FIG. 4 is a transparent view from first main surface 11a side), for example. In addition, the electrical wiring 60 is formed in a predetermined pattern using a conductive material, for example, tungsten (W), molybdenum (Mo), manganese (Mn), copper (Cu), or the like, and functions as a feed wiring for supplying a current to or from the light emitting element 20.

Subsequently, the opening portion 12 which penetrates the second insulating layer 42, is formed in the second insulating layer 42 which is laminated on the uppermost insulating layer of the plurality of first insulating layers 41.

In the opening portion 12, the inner peripheral surface 14 thereof is tilted so that each shape has a large open area on the first main surface 11a side of the substrate 10 rather than the mounting surface of the light emitting element 20, and it has, for example, a substantially rectangular shape when seen in a plan view. In addition, the opening shape may be not limited to the rectangle, and may have a substantially circular shape.

Such an opening portion 12 has a function of improving light extraction efficiency by reflecting light which is emitted from the light emitting element 20 in the inner peripheral surface 14 thereof upward.

In order to improve the light extraction efficiency, it is preferable to form the second insulating layer 42 using a material such as a porous ceramic material having a relatively good reflectivity with respect to light in a region of ultraviolet light, for example, an aluminum oxide sintered body, a zirconium oxide sintered body, or an aluminum nitride sintered body. In addition, it is preferable to provide a metal reflection film in the inner peripheral surface 14 of the opening portion 12 when considering improvement of the light extraction efficiency.

Such opening portions 12 are disposed in the whole first main surface 11a of the substrate 10, for example, in a positive grid pattern. By arranging the opening portions in the positive grid pattern, it is possible to arrange the light emitting elements 20 more densely, and to increase the intensity of illuminance per unit area.

In addition, when it is possible to sufficiently secure the intensity of illuminance per unit area, the opening portions may be disposed in a pattern of a houndstooth check, and it is not necessary to limit the arrangement pattern.

As described above, the substrate 10 which includes the laminated body 40 which is configured by the first insulating layer 41 and the second insulating layer 42, is manufactured through the following processes when the first insulating layer 41, or the second insulating layer 42 is formed of ceramics, or the like. First, a plurality of ceramic green sheets which are created using a well-known method in the related art are prepared. An opening corresponding to the opening portion, and an opening for arranging the first heat transfer member 50a are formed on the ceramic green sheet using a method such as punching, or the like, as necessary. Subsequently, metal paste which forms the second heat transfer member 50b, and the inner wiring 60 is printed on the green sheet, and then the green sheets are laminated so that the printed metal paste is located between the green sheets, and the first heat transfer member 50a is disposed at the opening which is formed through punching or the like. As the metal paste for forming the inner wiring 60, for example, there is paste containing metal such as tungsten (W), molybdenum (Mo), manganese (Mn), copper (Cu), or the like. Subsequently, when the above-described laminated body is fired, the green sheet, the metal paste, and the first heat transfer member 50a are fired together, accordingly, it is possible to form the substrate 10 including the first heat transfer member 50a, the second heat transfer member 50b, and the inner wiring 60.

In addition, metallization of the first heat transfer member may be performed by preparing a metal paste, filling the opening which is formed on the green sheet with the metal paste, and firing the metal paste, in addition to the method of arranging the first heat transfer member as solid metal, as described above.

In addition, when the first insulating layer 41 or the second insulating layer 42 is formed of a resin, a manufacturing method of the substrate 10 can be considered as follows, for example. First, a precursor sheet of thermosetting resin is prepared. Subsequently, a lead terminal constituting the inner wiring 60, which is formed of a metal material, is disposed between the precursor sheets, and the plurality of precursor sheets are laminated so that the lead terminal is embedded in the precursor sheets. As materials for forming the lead terminal, for example, there are metal materials of Cu, Ag, Al, iron (Fe)-nickel (Ni)-cobalt (Co) alloy, Fe—Ni alloy, or the like. In addition, the opening corresponding to the opening portion 12, and the opening in which the first heat transfer member 50a is disposed are formed using a method such as laser machining, or etching in the precursor sheet, and then are thermally cured, whereby the substrate 10 is completed.

Meanwhile, the connection pad 13 which is electrically connected to the light emitting element 20, the light emitting element 20 which is connected to the connection pad 13 using a bonding material 15 such as a gold (Au) wire, or an aluminum (Al) wire, and a sealing material 30 which seals the light emitting element 20 are provided in the opening portion 12 of the substrate 10.

The connection pad 13 is formed of a metal layer which is made of a metal material, for example, tungsten (W), molybdenum (Mo), manganese (Mn), copper (Cu), or the like. In addition, a nickel (Ni) layer, a palladium (Pd) layer, a gold (Au) layer, or the like, may be further laminated on the metal layer, as necessary. The connection pad 13 is connected to the light emitting element 20 using soldering, or the bonding material 15 such as the gold (Au) wire, the aluminum (Al) wire, or the like.

In addition, the light emitting element 20 is configured by a light emitting diode which is formed by laminating a p-type semiconductor layer, an n-type semiconductor layer, or the like which is made of a semiconductor material such as GaAs or GaN, on an element substrate 21 such as a sapphire substrate, an organic EL element in which a semiconductor layer is made of an organic material, or the like.

The light emitting element 20 includes a semiconductor layer 22 having a light emitting layer, and element electrodes 23 (not shown) and 24 which are made of metal material such as Ag which is connected to the connection pad 13 which is disposed on the substrate 10 through the bonding material 15 such as the gold (Au) wire, the aluminum (Al) wire, or the like, and is connected to the substrate 10 using wire bonding. In addition, the light emitting element 20 emits light with a predetermined wavelength, with predetermined brightness according to a current which flows between the element electrodes 23 and 24, and outputs the light to the outside directly, or through the element substrate 21. In addition, as is generally known, the element substrate 21 can be omitted.

In addition, according to the embodiment, the connection between the light emitting element 20 and the connection pad 13 is performed by the wire bonding using gold (Au) wire, aluminum (Al) wire, or the like, however, the connection may be performed by flip-chip bonding using soldering or the like as the bonding material 15.

According to the embodiment, an LED which emits UV light in which spectral peaks of the wavelength of light which is emitted by the light emitting element 20 is, for example, 250 (nm) to 395 (nm) or less is adopted. That is, according to the embodiment, as the light emitting element 20, a UV-LED element is adopted. In addition, the light emitting element 20 is formed by a well-known thin film formation technology.

In addition, the light emitting element 20 is sealed using the above-described sealing material 30.

The sealing material 30 is formed of an insulating material such as a light-transmitting resin material, and seals the light emitting element 20 well, thereby protecting the light emitting element 20 by preventing infiltration of water from the outside, and absorbing shocks from the outside.

In addition, by forming the sealing material 30 of a material having a refractive index between a refractive index of the element substrate 21 (in the case of sapphire: 1.7) configuring the light emitting element 20, and a refractive index of air (approximately 1.0), for example, silicone resin (refractive index: approximately 1.4) or the like, the efficiency of light extraction from the light emitting element 20 can be improved.

The sealing material 30 is formed by filling the opening portion 12 with a precursor such as silicone resin, and curing the resin after mounting the light emitting element 20 on the substrate 10.

Second Embodiment of Light Irradiation Module

Figure 5:
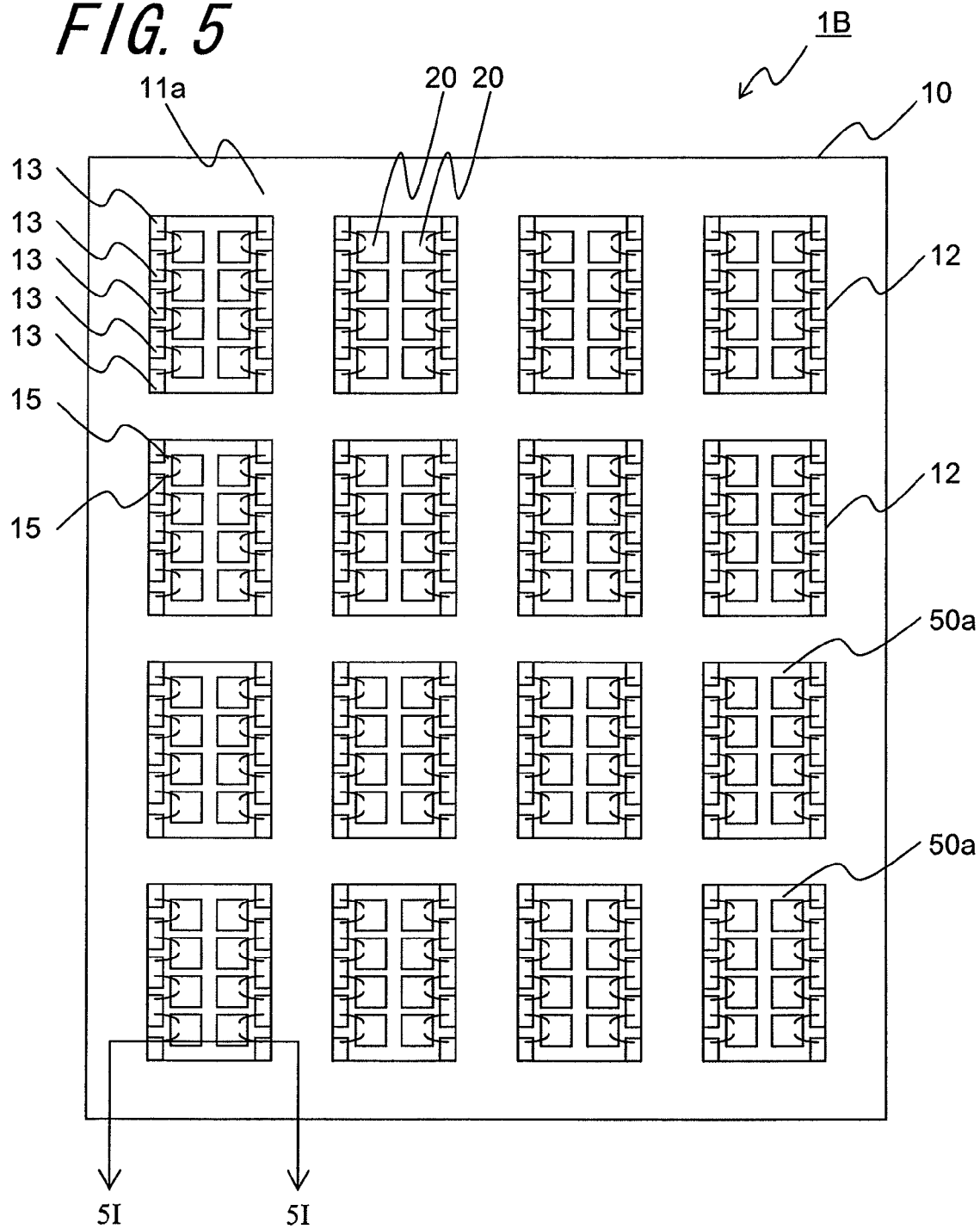
FIG. 5 is a plan view of a light irradiation device according to a second embodiment of the invention.
Figure 6:
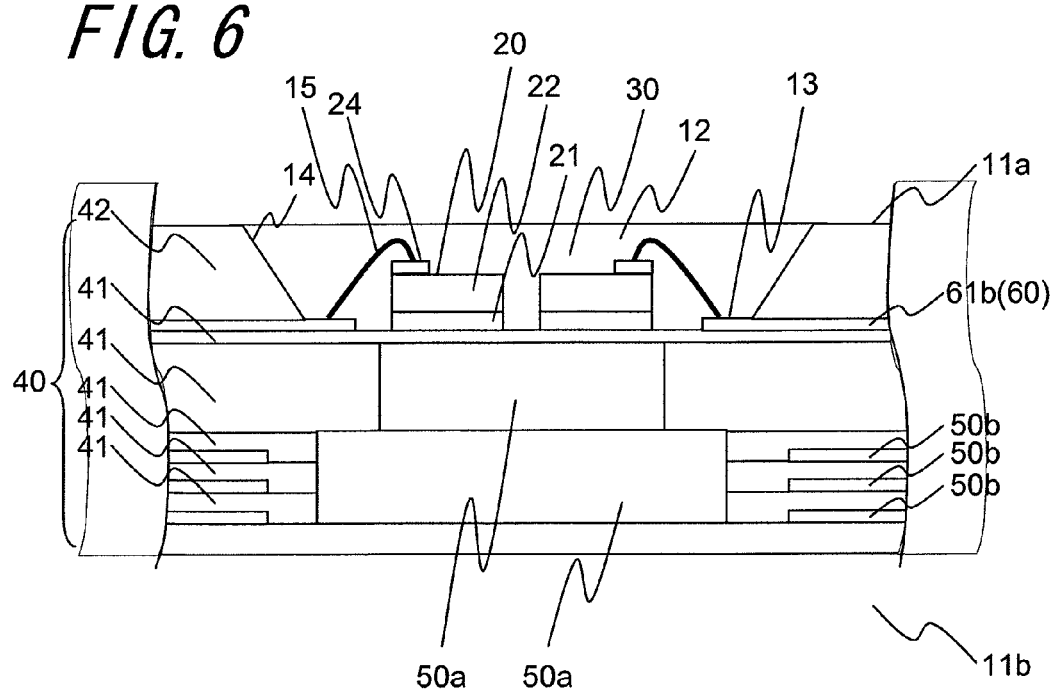
FIG. 6 is a cross-sectional view taken along the line 5I-5I of the light irradiation device illustrated in FIG. 5.

A light irradiation device 1B according to a second embodiment of the invention is illustrated in FIGS. 5 and 6. A basic configuration, functions, and manufacturing method of the light irradiation device 1B are the same as those of the above-described light irradiation device 1A. Accordingly, a different configuration or the like of the light irradiation device 1B from the light irradiation device 1A will be described below.

A difference in the embodiment from the first embodiment is the configuration of the substrate 10. Specifically, the embodiment is different from the first embodiment in that the first insulating layer 41 is interposed between the light emitting element 20 and the first heat transfer member 50a, and the top face of the first heat transfer member 50a is covered by the first insulating layer 41. In this manner, the light emitting element 20 is mounted on the top face of the first heat transfer member 50a through the first insulating layer 41. For this reason, an insulation property between the light emitting element 20 and the first heat transfer member 50a is improved, and it is possible to improve an electrical reliability of the light irradiation device 1B. In addition, it is possible to reduce warping of the substrate 10 due to a thermal expansion of the first heat transfer member 50a. In addition, it is preferable to have the smaller thickness than that of the first insulating layer which covers the first heat transfer member 50a when considering the heat radiation property.

When the first insulating layer 41 or the second insulating layer 42 of the substrate 10 according to the embodiment is manufactured using ceramics, the manufacturing method is different from that of the first embodiment in that the first heat transfer member 50a is disposed at the opening corresponding to the opening portion 12, and a green sheet which is laminated so as to cover the opening portion 12 is fired.

When the first insulating layer 41 or the second insulating layer 42 of the substrate 10 according to the embodiment is manufactured using resin, the manufacturing method is different from that of the first embodiment in that the first heat transfer member 50a is disposed at the opening corresponding to the opening portion 12, a precursor sheet which is formed of thermosetting resin is laminated so as to cover the opening portion 12, and the precursor sheet is subjected to thermosetting.

Embodiment of Surface Mount Light Irradiation Module

Figure 7:
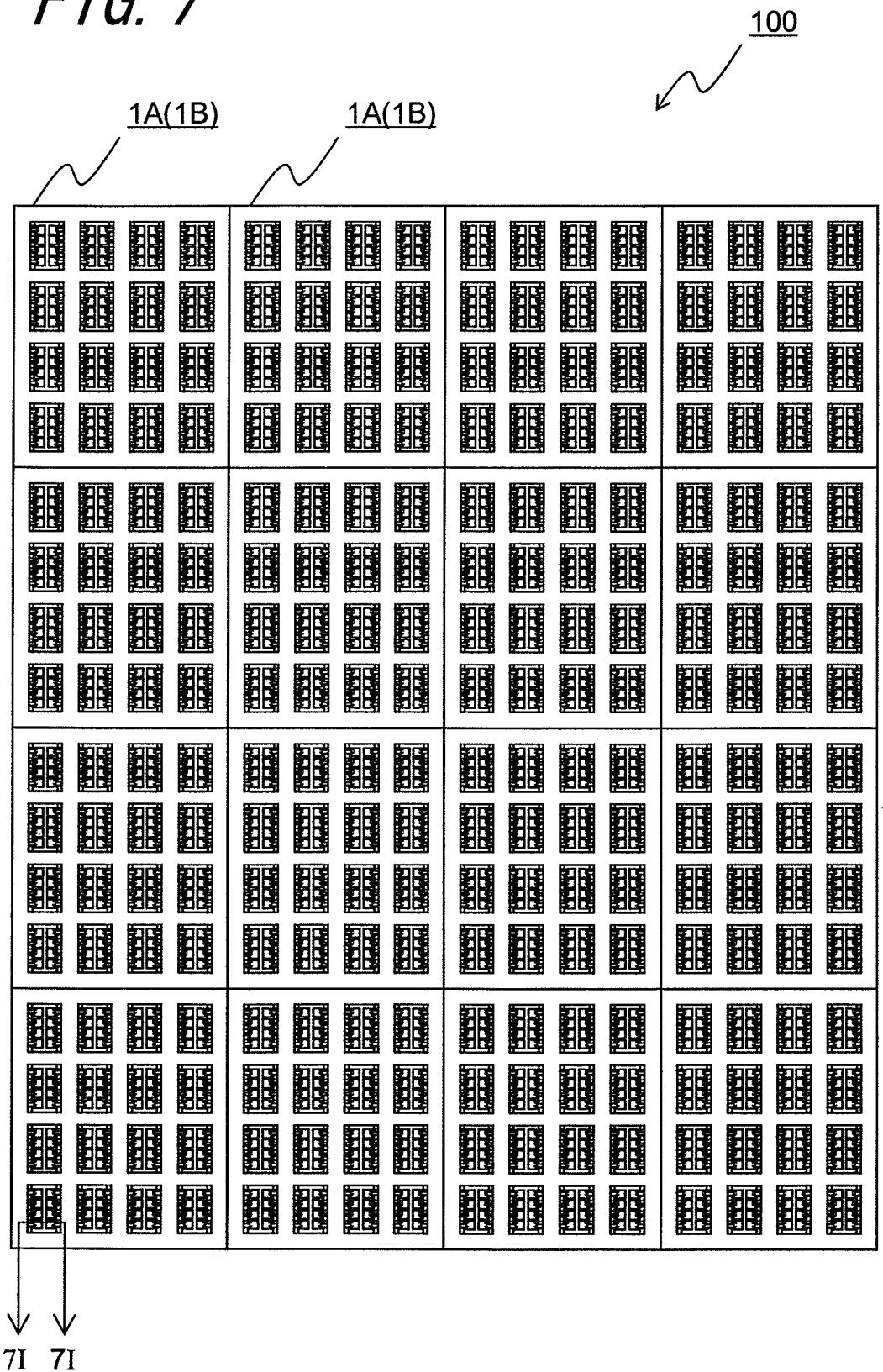
FIG. 7 is a plan view of a light irradiation module using the light irradiation device of FIG. 1.
Figure 8:
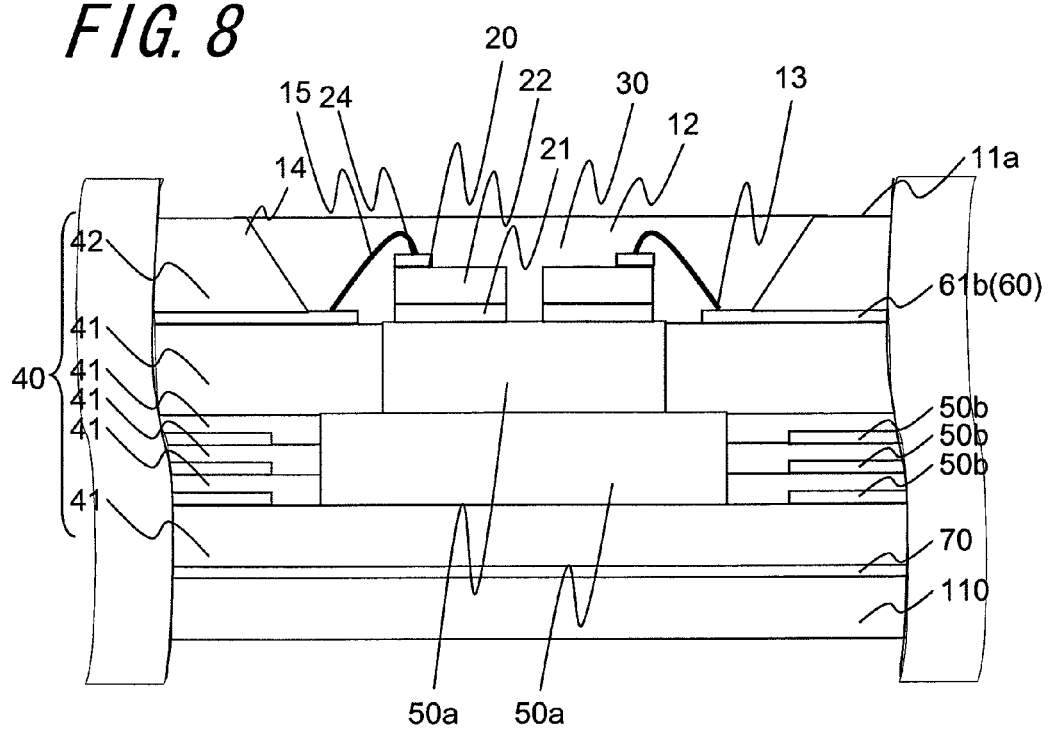
FIG. 8 is a cross-sectional view taken along the line 7I-7I of the light irradiation module illustrated in FIG. 7.

The light irradiation module 100 which is illustrated in FIGS. 7 and 8 includes a heat radiation member 110, and either the plurality of light irradiation devices 1A, or the plurality of light irradiation devices 1B, which are disposed in the heat radiation member 110.

The heat radiation member 110 functions as a support body of the plurality of light irradiation devices 1A, or the plurality of light irradiation devices 1B. As a material for forming the heat radiation member 110, it is preferable to use a material with a high thermal conductivity, and for example, there are various metal materials, ceramics, and resin materials that may be used. The heat radiation member 110 according to the embodiment is formed of copper.

On the other hand, the light irradiation devices 1A, or the light irradiation devices 1B are adhered to the heat radiation member 110 using an adhesive 70 such as silicone resin or epoxy resin, and are disposed in a matrix on the heat radiation member 110.

It is preferable that the light irradiation devices 1A or light irradiation devices 1B adjacent to each other are close to each other in order to make illuminance distribution in the surface of the light irradiation module 100 uniform.

In addition, in the light irradiation module 100, since heat which is generated from the light emitting element 20 easily fills the vicinity of the center of the module, rather than the vicinity of the outer periphery of the module, it is also possible to make the temperature on the surface of the light irradiation module 100 uniform by making the shapes of the first and second heat transfer members 50a and 50b of the light irradiation device 1A or the light irradiation device 1B, which are disposed in the vicinity of the center of the module, different from the shapes of the first and second heat transfer members 50a and 50b of the light irradiation device 1A or the light irradiation device 1B which are disposed in the vicinity of the outer periphery of the module. Specifically, it is set such that a relatively large amount of the first and second heat transfer members 50a and 50b of the light irradiation module 1 are disposed in the vicinity of the center of the module, and a relatively small amount of the first and second heat transfer members 50a and 50b of the light irradiation module 1 are disposed in the vicinity of the outer periphery of the module. By doing that, it is possible to increase the heat radiation property in the vicinity of the center of the module, and to make the variation in temperature in the surface of the module relatively small. Since the light emission illuminance of the light emitting element 20 varies depending on ambient temperature in the vicinity of the light emitting element 20, it is possible to make the illuminance in the surface of the light irradiation module 100 uniform by making the temperature on the surface of the light irradiation module 100 uniform.

Embodiment of Printing Apparatus

Figure 9:
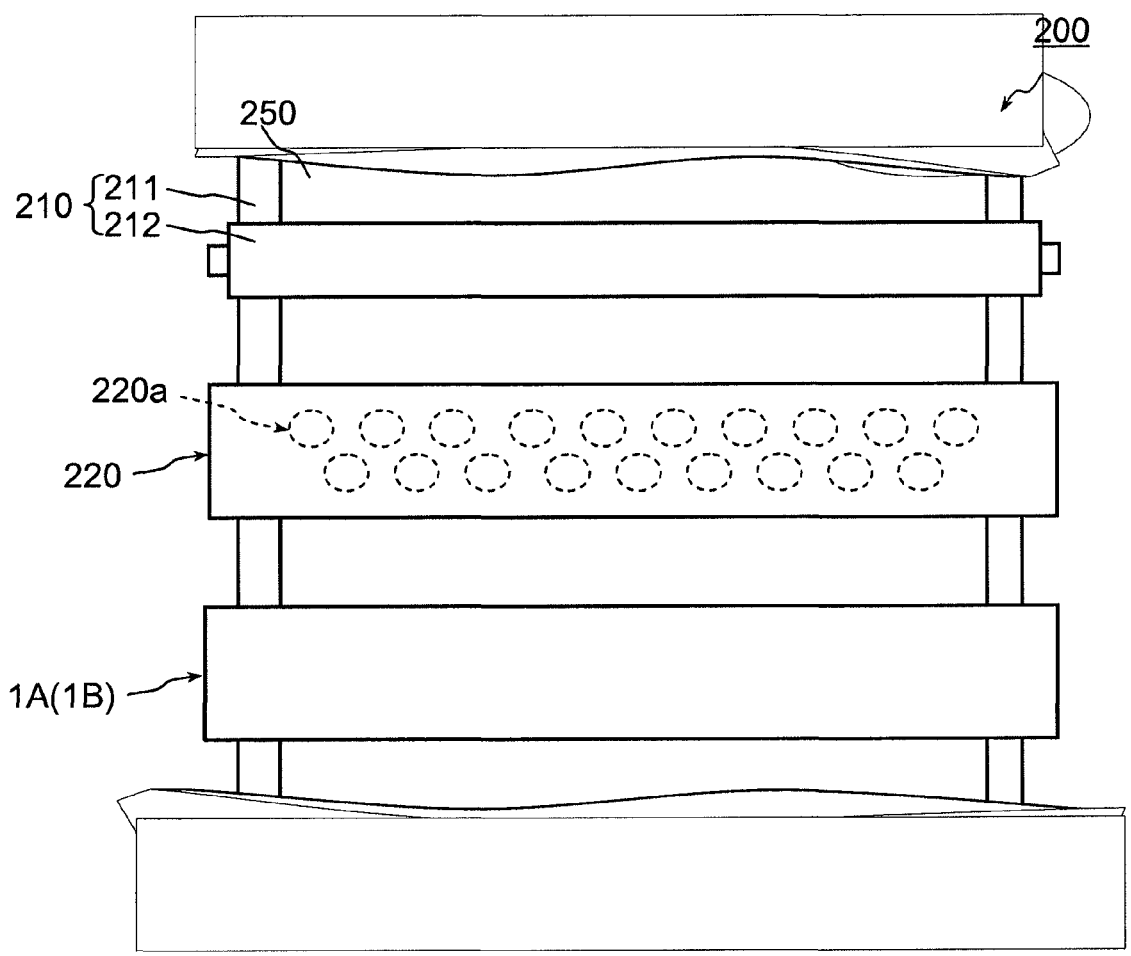
FIG. 9 is a top view of a printing apparatus using the light irradiation module illustrated in FIG. 7.
Figure 10:
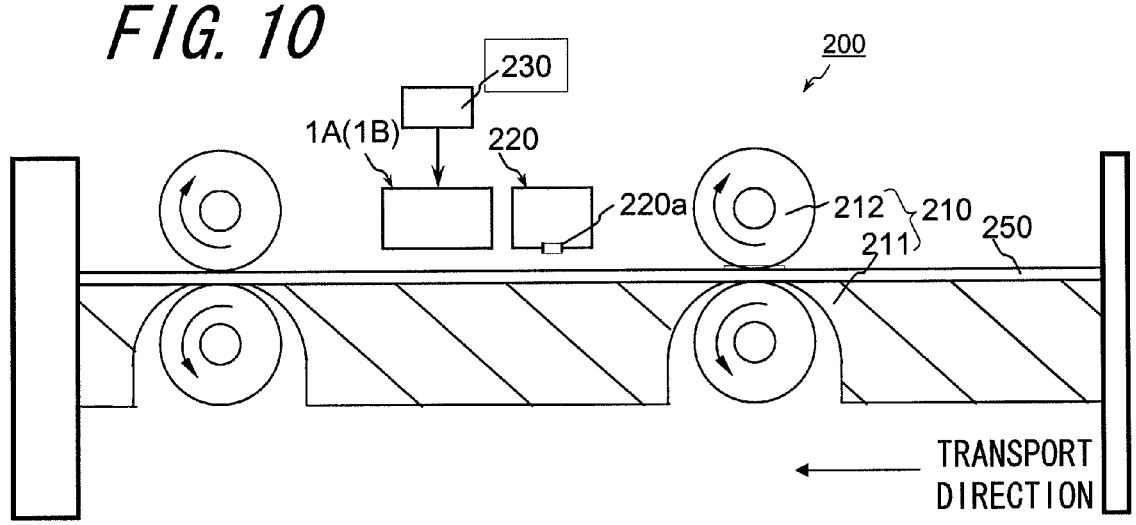
FIG. 10 is a side view of the printing apparatus illustrated in FIG. 9.

As an embodiment of a printing apparatus of the invention, a printing apparatus 200 which is illustrated in FIGS. 9 and 10 will be described as an example. The printing apparatus 200 includes a transport mechanism 210 for transporting a recording medium 250, an ink jet head 220 as a printing mechanism for performing printing on the transported recording medium 250, the above-described light irradiation module 100 for irradiating the printed recording medium 250 with UV light, and a control mechanism 230 for controlling light emission of the light irradiation module 100.

The transport mechanism 210 is a mechanism for transporting the recording medium 250 so as to pass the ink jet head 220, and the light irradiation module 1 in that order, and includes a platen 211, and a pair of transport rollers 212 which is disposed to face each other and is rotatably supported. The recording medium 250 which is supported by the platen 211 is transported between the pair of transport rollers 212, and is transported in the transport direction by rotating the transport rollers 212.

The ink jet head 220 has a function of attaching a photosensitive material onto the recording medium 250 which is transported through the transport mechanism 210. The ink jet head 220 has a configuration in which liquid droplets including the photosensitive material are discharged toward the recording medium 250, and the liquid droplets are deposited on the recording medium 250. According to the embodiment, as the photosensitive material, UV curable ink is adopted. As the hotosensitive material, for example, there is photosensitive resist, photocurable resin, or the like, in addition to the UV curable ink.

According to the embodiment, a line-type ink jet head is adopted as the ink jet head 220. The ink jet head 220 has a configuration in which a plurality of discharge holes 220a, which are disposed in a line, are included, and the UV curable ink is discharged from the discharge holes 220a. The ink jet head 220 performs printing with respect to the recording medium 250 by discharging ink from the discharge holes 220a with respect to the recording medium 250 which is transported in a direction which is orthogonal to the arrangement of the discharge holes 220a, and causing the ink to be deposited on the recording medium 250.

In addition, according to the embodiment, the line-type ink jet head is exemplified as the printing mechanism, however, it is not limited to this. For example, a serial-type ink jet head may be adopted, or a line-type spray head, or a serial-type spray head may be adopted. Further, as the printing mechanism, an electrostatic-type head may be adopted in which static electricity of the recording medium 250 is accumulated, and the photosensitive material is attached onto the recording medium using the static electricity, and a dip device may be adopted in which the recording medium 250 is dipped in a liquid-type photosensitive material, and the photosensitive material is attached to the recording medium. In addition, as the printing mechanism, a paint brush, a brush, or a roller may be adopted.

The light irradiation module 100 in the printing apparatus 200 has a function of exposing the recording medium 250 to light, which is transported through the transport mechanism 210, and on which the photosensitive material is attached. The light irradiation module 100 is provided on the downstream side of the ink jet head 220 in the transport direction. In addition, the light emitting element 20 in the printing apparatus 200 has a function of exposing the photosensitive material, which is attached onto the recording medium 250, to light.

The control mechanism 230 has a function of controlling light emission of the light irradiation module 100. Information on characteristics of light which make the curing of the ink droplets discharged from the ink jet head 220 relatively good is stored in a memory of the control mechanism 230. As specific examples of the stored information, there are a wavelength distribution property which is suitable for curing the discharged ink droplets, and a numerical value which denotes emission intensity (emission intensity in each wavelength region). The printing apparatus 200 according to the embodiment is also able to adjust a magnitude of a driving current which is inputted to the plurality of light emitting elements 20 based on the stored information of the control mechanism 230 by including the control mechanism 230. Due to this, according to the printing apparatus 200, it is possible to emit light with a suitable light amount corresponding to a property of ink to be used, and to cure ink droplets using light with relatively low energy.

In the printing apparatus 200, the transport mechanism 210 transports the recording medium 250 in the transport direction. The ink jet head 220 discharges the UV curable ink onto the transported recording medium 250, and causes the UV curable ink to attach to the surface of the recording medium 250. At this time, the UV curable ink which is caused to attach to the recording medium 250 may attach to the whole surface, may be partially attached, or may be attached in a desired pattern. In the printing apparatus 200, the UV curable ink is cured when the UV curable ink which is attached onto the recording medium 250 is irradiated with the UV light which is emitted from the light irradiation module 100.

The printing apparatus 200 according to the embodiment is able to enjoy the effects which are included in the light irradiation module 100. For this reason, in the printing apparatus 200, it is possible to suppress the variation in illuminance in the surface of the light irradiation module 100 so as to be relatively small since it is possible to make the distribution of temperature in the surface of the light irradiation module 100 due to the heat generation in the light emitting element 20 relatively small, and as a result, it is possible to irradiate the recording medium 250 with the UV light uniformly in a wide range. Accordingly, in the printing apparatus 200, it is possible to stably irradiate the photosensitive material with the UV light.

In the printing apparatus 200 according to the embodiment, it is possible to arrange the light irradiation device 1A or the light irradiation device 1B close to the recording medium 250, since the variation in illuminance in the surface of the light irradiation module 100 is relatively small. For this reason, the printing apparatus 200 is suitable for miniaturizing the apparatus.

Hitherto, the specific embodiments of the invention have been described, however, the invention is not limited to this, and it is possible to perform various modifications without departing from the scope of the invention.

Figure 11:
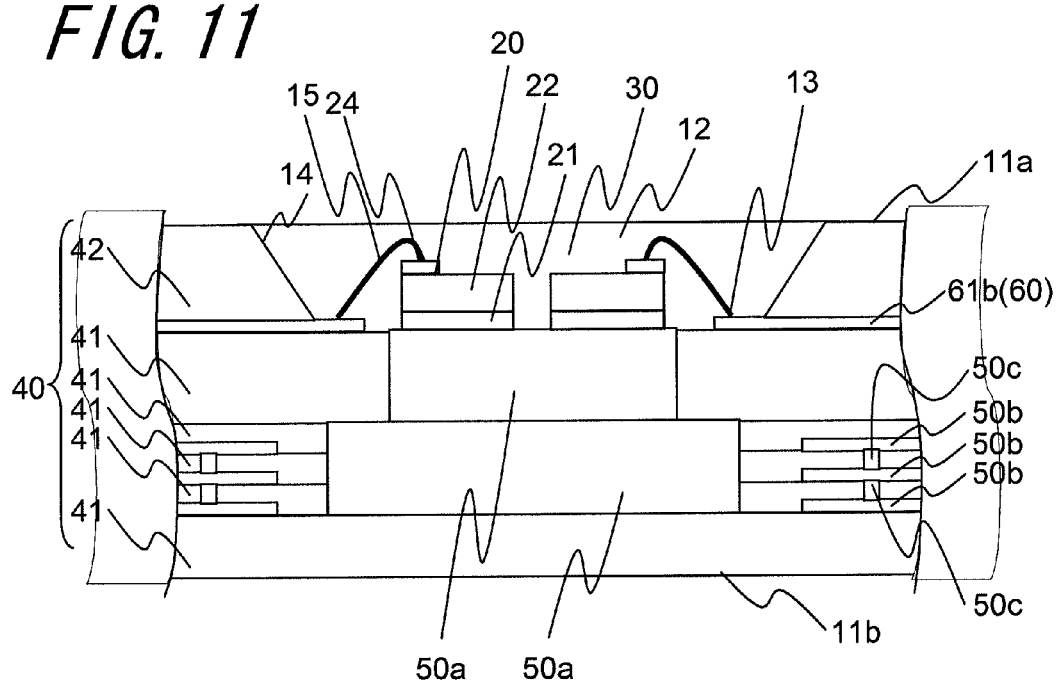
FIG. 11 is a cross-sectional view illustrating a first modified example of the light irradiation device of FIG. 1.

For example, as illustrated in FIG. 11, it is preferable to connect the plurality of second heat transfer members 50b included in the light irradiation device 1A through a third heat transfer member 50c. By connecting the second heat transfer members 50b in this manner, it is possible to further increase the heat radiation property. The reason for this is that heat is transferred to the second heat transfer member 50b at a low temperature from the second heat transfer member 50b with a high temperature through the third heat transfer member 50c, and the heat is distributed to the second heat transfer member 50b, thereby reducing the variation in temperature of the second heat transfer member 50b.

Figure 12:
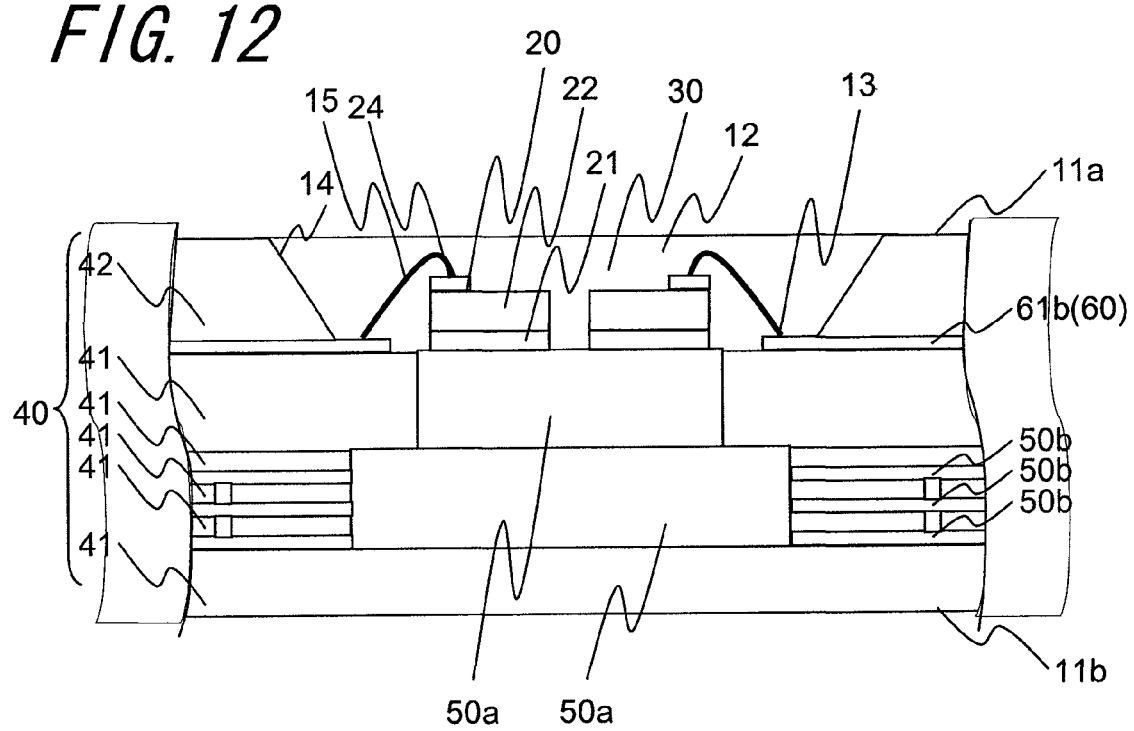
FIG. 12 is a cross-sectional view illustrating a second modified example of the light irradiation device of FIG. 1.

In addition, as illustrated in FIG. 12, the first heat transfer member 50a and the second heat transfer member 50b of the light irradiation device 1A may be connected to each other. By connecting them in this manner, it is possible to further increase the heat radiation property since the heat which is generated from the light emitting element 20 is effectively radiated to the second heat transfer member 50b from the first heat transfer member 50a.

Figure 13:
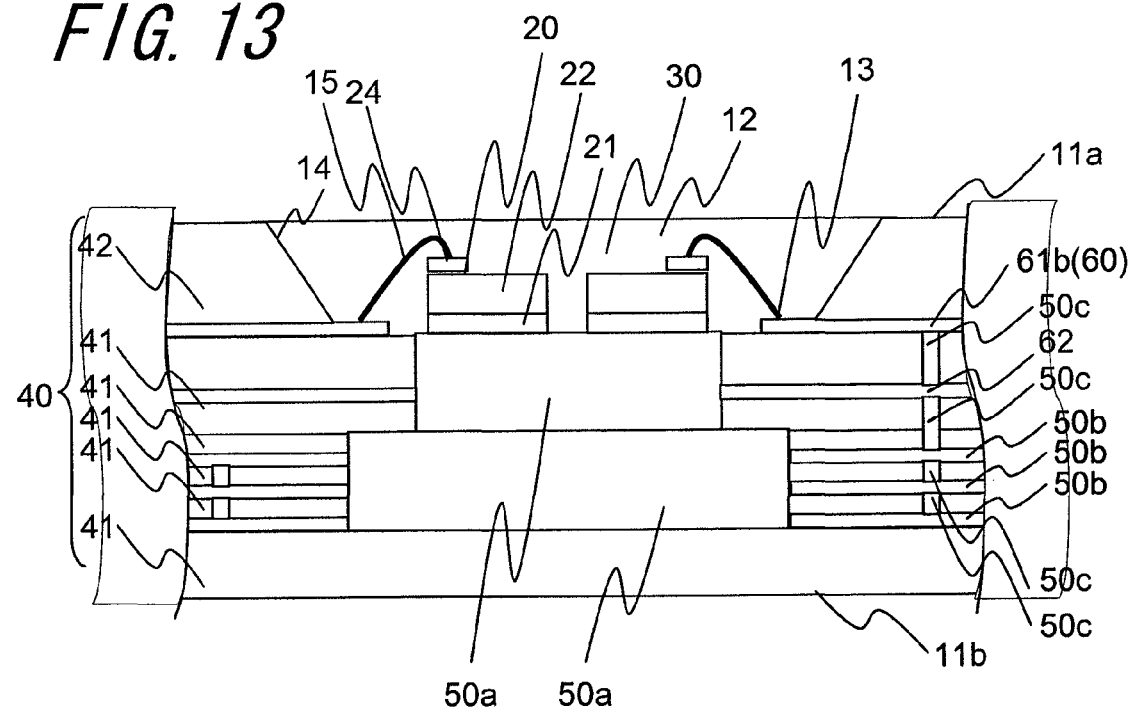
FIG. 13 is a cross-sectional view illustrating a third modified example of the light irradiation device of FIG. 1.

Further, as illustrated in FIG. 13, an electrode layer 62 which is connected to any one of the anode wiring 61a and the cathode wiring 61b of the light irradiation device 1A may be included, and the electrode layer 62 may also be used as the second heat transfer member 50b. In addition, in FIG. 14, the way in which the electrode layer 62 is disposed is illustrated in a transparent view from the first main surface 11a side. By arranging the electrode layer 62 in this manner, it is possible to make the cross-sectional area of the electrical wiring 60 large, and to stabilize electricity supply. In addition, it is possible to arrange more heat transfer members using the laminated body 40 with the same volume, and to further increase the heat radiation property by making the electrode layer 62 also function as the second heat transfer member 50b. Otherwise, since it is possible to arrange the second heat transfer member 50b with the same volume even when the volume of the laminated body 40 is reduced, by making the electrode layer 62 also function as the second heat transfer member 50b, it is possible to miniaturize the light irradiation device 1A and the light irradiation module 100.

In addition, as illustrated in FIG. 15, the first heat transfer member 50a of the light irradiation device 1A may be exposed from the second main surface 11b. By configuring in this manner, it is possible to further effectively radiate heat which is generated from the light emitting element 20.

Figure 17:
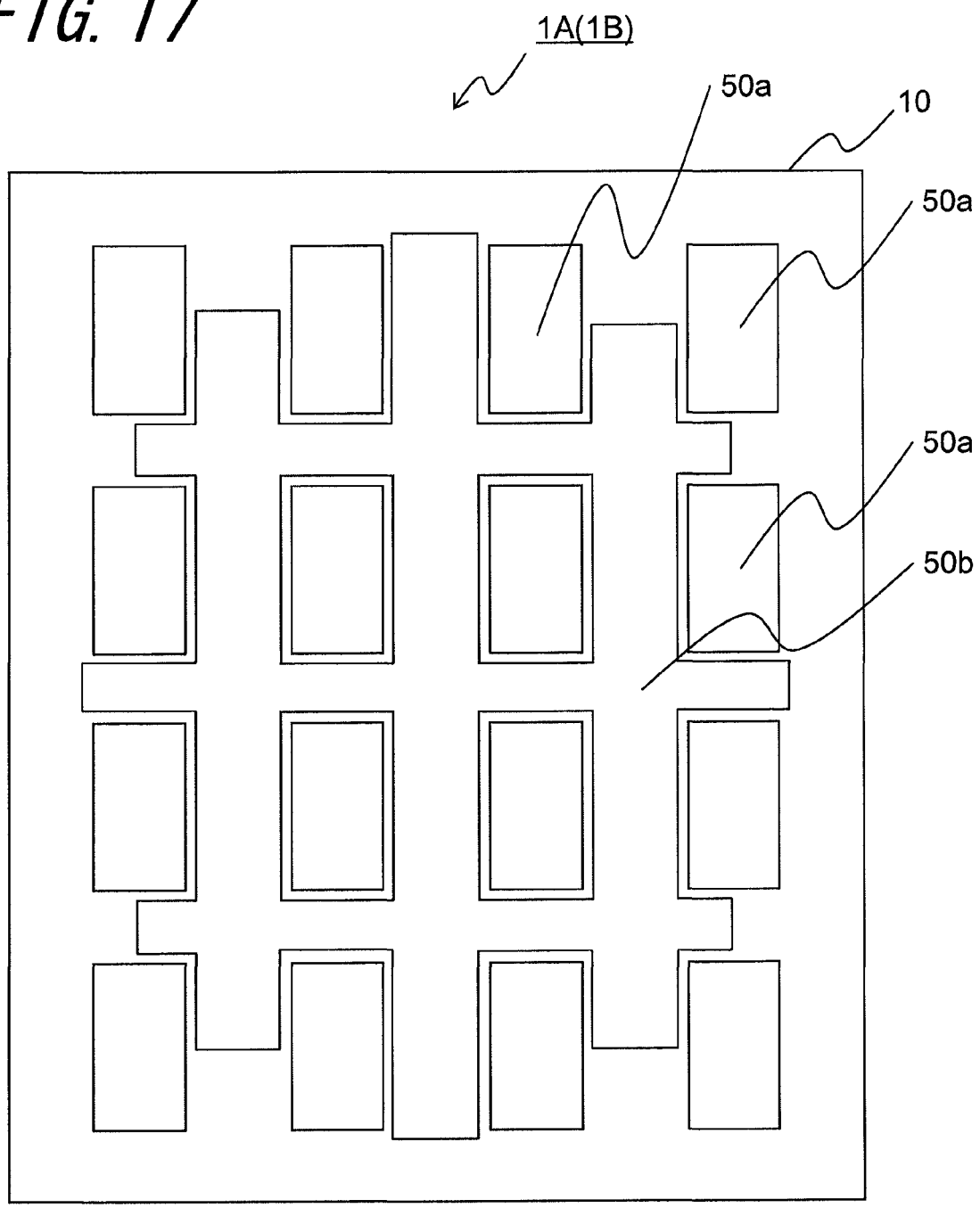
FIG. 17 is a diagram for describing a shape of the second heat transfer member.
Figure 18:
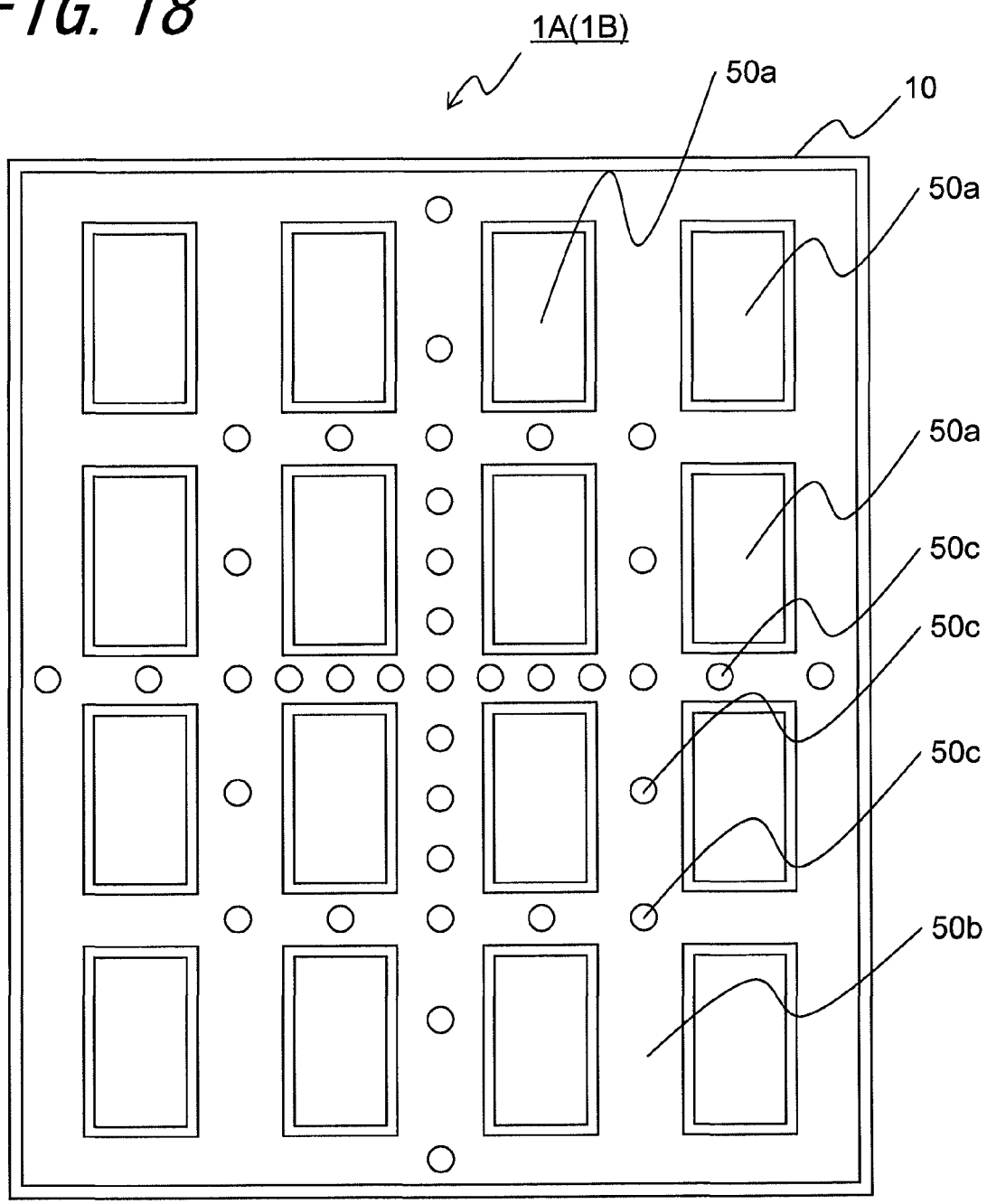
FIG. 18 is a diagram for describing an arrangement position of a third heat transfer member which connects the second heat transfer members to one another.

Further, as illustrated in FIG. 16, the second heat transfer member 50b of the light irradiation device 1A may be disposed between the first heat transfer member 50a and the second main surface 11b. By configuring in this manner, it is possible to make the heat generation from the light emitting element 20 more effectively. In addition, the second heat transfer member 50b of the light irradiation device 1A may be disposed at the center portion of the substrate 10 at which a temperature becomes high due to the heat generation from the light emitting element 20 as illustrated in FIG. 17, and the second heat transfer member 50b need not be disposed at the outer periphery of the substrate 10. By configuring in this manner, it is possible to make a variation in temperature in the surface of the light irradiation device 1A relatively small. Further, as a method of making the variation in temperature in the surface of the light irradiation device 1A relatively small, when connecting the second heat transfer members 50b to the third heat transfer members 50c, the number of third heat transfer members 50c may be set to be smaller in the outer periphery of the substrate 10 than at the center portion of the substrate 10 as illustrated in FIG. 18. This is because, by configuring in this manner, it is possible to more effectively radiate heat at the center portion of the substrate 10.

In addition, though it is not shown, better heat radiation is performed in the vicinity of the center of the substrate 10, and it is possible to make the variation in temperature at the surface of the light irradiation device 1A relatively small by making a size of the first heat transfer member 50a, which is disposed in the outer periphery of the substrate 10, smaller than that of the first heat transfer member 50a which is disposed at the center portion of the substrate 10.

Further, it is preferable that the thermal conductivity of the second heat transfer member 50b is higher than that of the first heat transfer member 50a. By doing so, the heat generated from the light emitting element 20 is transferred to the second heat transfer member 50b from the first heat transfer member, and can be effectively radiated.

In addition, it is preferable that the thermal expansion coefficient of the first heat transfer member 50a is closer to the thermal expansion coefficient of the first insulating layer 41, rather than the thermal expansion coefficient of the second heat transfer member 50b. By configuring in this manner, it is possible to increase the heat radiation property while preventing separation of the laminated body 40 from the first heat transfer member 50a, or the like by relatively suppressing thermal stress which occurs between the first insulating layer 41 and the first heat transfer member 50a, between the first insulating layer 41 and the second heat transfer member 50b, and between the first heat transfer member 50a and the second heat transfer member 50b.

Hitherto, various modification examples in the light irradiation device 1A have been described, however, as a matter of course, the various modified examples can also be applied to the light irradiation device 1B.

In addition, in the above-described light irradiation module 100, for example, though it is not shown, at least one of the first heat transfer member 50a, the second heat transfer member 50b, and the electrode layer 62 of the light irradiation device 1A or the light irradiation device 1B may be connected to the heat radiation member 110 through the third heat transfer member 50c. By configuring in this manner, it is possible to increase the heat radiation property.

Further, it is possible to further increase the heat radiation effect by providing a flow path through which refrigerant for cooling flows in the heat radiation member 110.

In addition, the embodiment of the printing apparatus 200 is not limited to this. For example, it may be a so-called offset printing printer in which a pivotally supported roller is rotated, and a recording medium is transported along the surface of the roller, and the printer has the same effect.

According to the embodiment, an example in which the light irradiation module 100 is applied to the printing apparatus 200 in which the ink jet head 220 is used has been described, however, the light irradiation module 100 can also be applied when curing various types of photocurable resin, for example, such as a dedicated device which cures photocurable resin which is spin-coated on the surface of an object. In addition, the light irradiation module 100 may be also used, for example, in an irradiation light source or the like, in exposure equipment.

REFERENCE SIGNS LIST 1A, 1B: Light irradiation device
10: Substrate
11a: First main surface
11b: Second main surface
12: Opening portion
13: Connection pad
14: Inner peripheral surface
15: Bonding material
20: Light emitting element
21: Element substrate
22: Semiconductor layer
23, 24: Element electrode
30: Sealing material
40: Laminated body
41: First insulating layer
42: Second insulating layer
50a: First heat transfer member
50b: Second heat transfer member
50c: Third heat transfer member
60: Electrical wiring
61a: Anode wiring
61b: Cathode wiring
61c: Common wiring
62: Electrode layer
70: Adhesive
100: Light irradiation module 110: Heat radiation member
200: Printing apparatus
210: Transport mechanism
211: Platen
212: Transport roller
220: Ink jet head
220a: Discharge hole
250: Recording medium

The invention claimed is:

1. A light irradiation device, comprising:
   a light emitting element; and
   a substrate on which the light emitting element is mounted, the substrate comprising a laminated body constituted so that a plurality of insulating layers are laminated, a first heat transfer member disposed in the laminated body so that a part thereof is located directly below the light emitting element, and a second heat transfer member disposed between the insulating layers so as to surround the first heat transfer member when seen in a plan view,
   thermal conductivities of the first heat transfer member and second heat transfer member being higher than a thermal conductivity of the laminated body,
   wherein a top face of the first heat transfer member is covered by a part of the insulating layer, and the light emitting element is mounted on the top face of the first heat transfer member through the part of the insulating layer.

2. The light irradiation device according to claim 1, wherein the substrate comprises a plurality of the second heat transfer members, which are disposed between the plurality of insulating layers, respectively, and which are connected to each other through a third heat transfer member.

3. The light irradiation device according to claim 1, wherein the first heat transfer member and the second heat transfer member are connected to each other.

4. The light irradiation device according to claim 1, further comprising:
   an electrical wiring which is disposed on at least one of the surface and an inside of the laminated body, and via which light emitting elements are electrically connected to each other, the electrical wiring comprising an anode wiring connected to an anode of the light emitting element, a cathode wiring connected to a cathode of the light emitting element, and a common wiring which connects the anode and the cathode of the light emitting element; and
   an electrode layer which is connected to any one of the anode wiring and the cathode wiring by being interposed between the insulating layers which are close thereto.

5. The light irradiation device according to claim 4, wherein the second heat transfer member also functions as the electrode layer.

6. The light irradiation device according to claim 4, wherein the electrode layer is connected to the second heat transfer member.

7. The light irradiation device according to claim 4, wherein the electrode layer is connected to the first heat transfer member.

8. The light irradiation device according to claim 1, wherein the thermal conductivity of the second heat transfer member is higher than the thermal conductivity of the first heat transfer member.

9. The light irradiation device according to claim 1, wherein a thermal expansion coefficient of the first heat transfer member is closer to a thermal expansion coefficient of the insulating layer, rather than a thermal expansion coefficient of the second heat transfer member.

10. A light irradiation module, comprising:
    a plurality of the light irradiation devices according to claim 1; and
    a heat radiation member on which the plurality of the light irradiation devices are mounted.

11. A light irradiation module, comprising:
    a plurality of the light irradiation devices according to claim 6; and
    a heat radiation member on which the plurality of the light irradiation devices are mounted.

12. The light irradiation module according to claim 11, wherein at least one of the first heat transfer member, the second heat transfer member, and the electrode layer is connected to the heat radiation member.

13. A printing apparatus, comprising:
    printing means which performs printing on a recording medium; and
    the light irradiation module according to claim 10, the light irradiating module irradiating the printed recording medium with light.

14. A printing apparatus, comprising:
    printing means which performs printing on a recording medium; and
    the light irradiation module according to claim 11, the light irradiating module irradiating the printed recording medium with light.

* * * * *